United States Patent [19]

Azuma

[11] Patent Number: 4,487,315
[45] Date of Patent: Dec. 11, 1984

[54] TUBE ASSEMBLY FOR INTEGRATED CIRCUITS

[75] Inventor: Tadashi Azuma, Kanagawa, Japan

[73] Assignee: Fujimori Kogyo Co., Ltd., Japan

[21] Appl. No.: 469,450

[22] Filed: Feb. 24, 1983

[51] Int. Cl.³ .................. B65D 73/02; B65D 85/42
[52] U.S. Cl. .................................. 206/334; 206/328; 206/329
[58] Field of Search ............. 206/328, 329, 332, 334; 361/220, 212

[56] References Cited

U.S. PATENT DOCUMENTS

| | | | |
|---|---|---|---|
| 3,435,949 | 4/1969 | Suverkropp | 206/332 |
| 3,774,075 | 11/1973 | Medesha | 206/328 |
| 4,171,049 | 10/1979 | Nohara et al. | 206/334 |
| 4,371,078 | 2/1983 | Hunt et al. | 206/329 |

FOREIGN PATENT DOCUMENTS

| | | | |
|---|---|---|---|
| 153355 | 11/1980 | Japan | 206/334 |
| WO79/01123 | 12/1979 | PCT Int'l Appl. | 206/334 |

Primary Examiner—Joseph Man-Fu Moy
Attorney, Agent, or Firm—Cantor and Lessler

[57] ABSTRACT

A tube assembly for integrated circuits, wherein a transparent conductive layer is applied to at least one side of a transparent cylindrical member formed of a synthetic resin, a rail member formed of a conductive synthetic resin and including an upper flat portion is inserted through, and comes in close contact with, the said cylindrical member in such a manner that it is movable only in the lengthwise direction of the said cylindrical member, and two grooves are formed in the said upper flat portion along the full length of the said rail member, in the lengthwise direction of said rail member, through which grooves both terminals of the said circuits are slidingly inserted in the lengthwise direction of the said rail member.

9 Claims, 7 Drawing Figures

U.S. Patent  Dec. 11, 1984  4,487,315
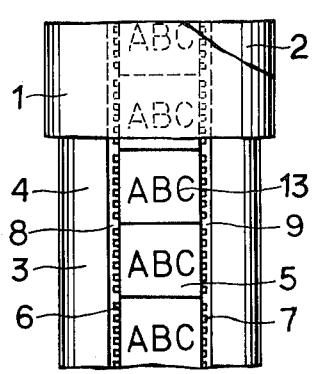
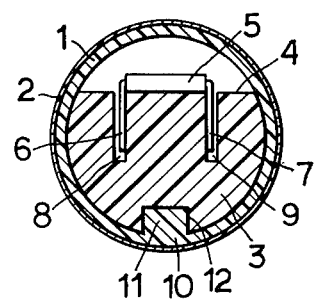
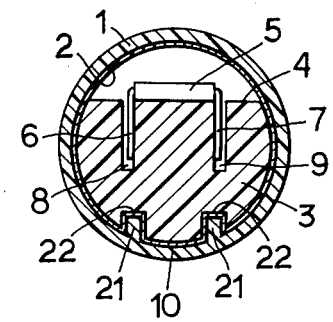
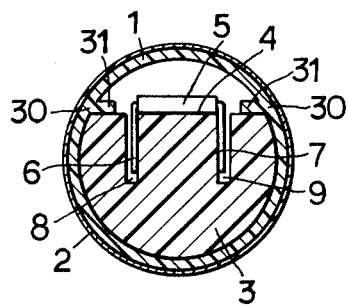
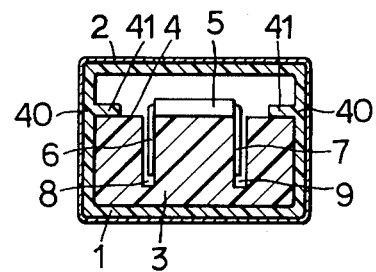
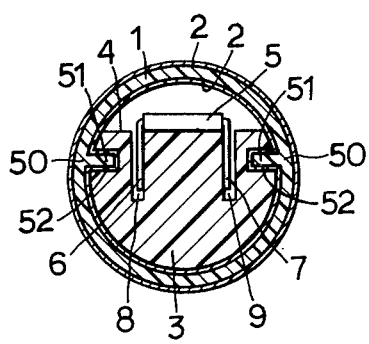
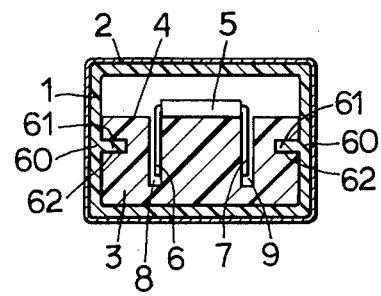

TUBE ASSEMBLY FOR INTEGRATED CIRCUITS

BACKGROUND OF THE INVENTION

The present invention relates to a tube assembly for integrated circuits which is suitable for packing, transportion and automatic inserting of integrated circuits.

More specifically, the invention is concerned with a tube assembly for integrated circuits which prevents turning of a rail to which the integrated circuits are attached, assures proper removal of the integrated circuits, assures easy visual identification of markings printed on the sides of the integrated circuits and ready detection of the presence of different types of integrated circuits and misalignment of integrated curcuits, prevents integrated circuits from being dusted, and reduces effectively the chances of breaking of integrated circuits due to electrostatic charge.

The conventional tubes for integrated circuits, which have enjoyed commercial use until now, are prepared by forming a lightweight and conductive metal such as aluminium into one piece wherein a rail is molded with a tube, adding a conductive material such as carbon black into a synthetic resin such as polyethylene, polypropylene or polyvinyl chloride, or coating an antistatic agent onto the previously formed polyvinyl chloride rail.

However, since these tubes for integrated circuits have an opaque outer surface, difficulties are encountered in visually identifying the markings on integrated circuits, and detecting the presence of different types of integrated circuits and misalignment of integrated circuits. In addition, the coated antistatic agent contaminates the attached integrated circuits, and when the antistatic agent is ununiformly coated, it is less effective so that electostatic charge troubles may take place.

SUMMARY OF THE INVENTION

A main object of the present invention is to provide a tube assembly for integrated circuits which is entirely or substantially free from the disadvantages of the prior art.

BRIEF DESCRIPTION OF THE DRAWINGS

FIG. 1 is a partially cut away part plan view;

FIG. 2 is a sectional view taken along-line A—A of FIG. 1; and

FIG. 3 to 7 inclusive are sectional views showing five alternate embodiments.

PREFERRED EMBODIMENTS OF THE INVENTION

One preferred embodiment of the present invention will now be explained with reference to FIGS. 1 and 2.

Prepared is a transparent cylindrical member 1 having a thickness of 0.1 to 3.0 mm and a circular cross-section, which is formed of, e.g., polyethylene, polypropylene, polyvinyl chloride, polystyrene, polycarbonate or cellulose derivatives. The member 1 is provided on its outer surface with a transparent conductive layer 2 by metallizing of 30 to 200 A in thickness of a rustproof metal such as indium oxide, tin oxide, chrome, nickel or nickel/chrome alloys.

A rail member 3 having a semi-circular or substantially circular cross-section is formed of a conductive synthetic resin such as polyethylene, polypropylene, polyvinyl chloride or polyester, the electric resistance of which is adjusted to not more than $10^8$ ohms square cm. by the addition of 10 to 40% by weight of a conductive material such as carbon black or finely divided metals.

With its upper flat portion 4 turned up, the rail 3 is inserted through, and comes in close contact with, the cylindrical member 1 in such a manner that it is movable lengthwise. The rail 3 is provided in its upper flat portion 4 with two lengthwise grooves 8 and 9 by which both terminals 6 and 7 of an integrated circuit 5 are slidingly guided in the lengthwise direction of the rail 3. Thus, a plurality of integrated circuits 5 are closely and successively held in place substantially along the entire length of the rail 3 with both their terminals 6 and 7 being inserted into the two grooves 8 and 9.

The cylindrical member 1 is formed in the inner surface of its bottom 10 with a lug or projection 11 which extends along the entire length of the member 1 in the lengthwise direction thereof. The projection 11 is slidingly inserted within a groove 12 formed in the bottom of the rail 3 along its full length.

It is noted that the conductive layer(s) 2 may be applied to the outer and/or inner surfaces of the cylindrical member 1.

Reference numeral 13 in FIG. 1 stands for a marking formed on integrated circuit 5.

The distance between both corners of integrated circuits 5 mounted on the rail 3 and the inner surface of the member 1 positioned just above the said corners is made shorter than the length of the terminals 6 and 7 so that the tube can be reversed with no fear of disengagement of the terminals 6 and 7 out of the grooves 8 and 9 in the rail 3 and hence of integrated circuits 5.

According to the foregoing embodiment of this invention, the transparent conductive layer 2 is applied to at least one side of the transparent cylindrical member 1 formed of a synthetic resin. The rail 3, which is formed of a synthetic resin and flattened at 4 on its upper surface, is inserted through, and comes in close contact with, the cylindrical member 1 in such a manner that it is movable only in the lengthwise direction thereof. The rail 3 is grooved at 8 and 9 in its upper flat portion 4 so as to slidingly receive both terminals of integrated circuit 5 in the lengthwise direction of the rail 3. The cylindrical member 1 is of a circular shape in cross-section, and the rail 3 is of a semi-circular or substantially circular shape in cross-section. The projection 11 is formed on the inner surface of the bottom 10 of the member 1 in the lengthwise direction thereof, and the groove 12 is formed in the bottom of the rail 3 in the lengthwise direction thereof. The projection 11 is then movably inserted within the groove 12.

Thus, with the tube assembly having integrated circuits 5 closely and successively arranged therein, there is no possiblity that the rail member 3 may turn during transporting handling such as removal of integrated circuits 5. Consequently, the integrated circuits 5 can properly be removed from one end of the tube. The transparent member 1 and the transparent conductive layer 2 assure visual identification of not only the markings 13 provided on the upper sides of integrated circuits 5 but also those printed on the sides thereof. In addition, it is easy to detect the presence of different types of integrated circuits or misaligned integrated circuits. Furthermore, the cylindrical member 1 prevents integrated circuits 5 from being dusted, and eliminates troubles and inconvenience caused by electrostatic charge in dust or structures. Still further, the conductivity of the rail member 3 prevents a buildup of electrostatic charge generated by vibrating or sliding movement of integrated circuits 5 attached to the rail 3, the latter movement taking place during detachment of integrated circuits 5, so that the integrated circuits 5 can be protected against electrostatic charge troubles.

Another embodiment of the present invention will now be explained with regerence to FIG. 3.

A cylindrical member 1 having a structure similar to that of the first embodiment is formed on its inner surface with a conductive layer 2 which is also similar to that of the first embodiment. The cylindrical member 1 is provided on the inner surface of its bottom with a plurality of lugs or projections 21 which extend along the full length of the member 1 in the lengthwise direction thereof. The projections 21 are then movably fitted into a plurality of grooves 22 formed in the bottom of a rail member 3 and caused to extend along the full length thereof.

Reference numerals identical with those used in the first embodiment indicate like parts, and no reference is made to the action and effect of this embodiment, since they are identical with those attained in the first embodiment.

A further embodiment of the present invention will now be explained with reference to FIG. 4.

A cylindrical member 1 having a structure similar to those used in the preceding embodiments is provided on the inner surfaces of both its sides 30 with a plurality of lugs or projections 31 which extend along the full length of the member 1 in the lengthwise direction thereof. The projections 31 then abut against the right and left sides of an upper flat portion 4 of a rail member 3 formed of a material similar to those used in the preceding embodiments.

Reference numerals identical with those used in the preceding embodiments indicate like parts, and reference to the action and effect of this embodiment is omitted, since they are identical with those attained in the preceding embodiments.

A still further embodiment of the present invention will now be explained with reference to FIG. 5.

A rail member 3 formed of a material similar to those used in the preceding embodiments is inserted through a cylindrical member 1 which is formed of a material similar to those used in the preceding embodiments, and has a rectangular cross-section. The member 1 is provided on the inner surfaces of its right and left sides with a plurality of lugs or projection 41 which extend along the full length of the member 1 in the lengthwise direction thereof. The projections 41 then take abutment onto the right and left sides of an upper flat portion 4 of the rail 3.

Reference numerals identical with those used in the preceding embodiments indicate like parts, and reference to the action and effect of this embodiments is omitted, since they are identical with those attained in the preceding embodiments.

A still further embodiment of the present invention will now be explained with reference to FIG. 6.

A cylindrical member 1 having a structure similar to those referred to in the preceding embodiments is applied with conductive layers 2 on its outer and inner surfaces. The member 1 is provided on the inner surface of its right and left sides with projections 51 extending along the full length of the member 1 in the lengthwise direction thereof. A rail member 3 formed of a material similar to those used in the preceding embodiments is provided therein with right and left grooves 52 which extend along the full length of the rail 3 in the lengthwise direction thereof. The projections 52 are then fitted into the grooves 52.

Reference numerals identical with those used in the preceding embodiments indicate like parts, and reference to the action and effect of this embodiment is omitted, since they are identical with those attained in the preceding embodiments.

A still further embodiment of the present invention will now be expalined with reference to FIG. 7.

A cylindrical member 1, which is formed of a material similar to those used in the preceding embodiments, and has a rectangular cross-section, is provided on the inner surfaces of its right and left sides 60 with lugs or projection 61 extending along the full length of the member 1 in the lengthwise direction thereof. The projections 61 are then movably fitted into right and left grooves 62 formed in a rail member 3 and caused to extend along the full length of the member 3 in the lengthwise direction thereof, said rail 3 being formed of a material similar to those used in the preceding embodiments and having a rectangular cross-section.

Reference numerals identical with those used in the preceding embodiments indicate like parts, and reference to the action and effect of this embodiment is omitted, since they are identical with those attained in the preceding embodiments.

What is claimed is:

1. A tube assembly for integrated circuits, wherein a transparent conductive layer is applied to at least one side of a transparent cylindrical member formed of a synthetic resin, a rail member formed of a conductive synthetic resin and including an upper flat portion is inserted through, and comes in close contact with the said cylindrical member in such a manner that it is movable only in the lengthwise direction of the said cylindrical member, and two grooves are formed in the said upper flat portion along the full length of the said rail member, in the lengthwise direction of the said rail member, through which grooves both terminals of the said circuits are slidingly inserted in the lengthwise direction of the said rail member.

2. The tube assembly for integrated circuits as recited in claim 1, wherein a transparent, 30 to 200-Å thick metallized layer is applied to the outer and/or inner surface of the transparent cylindrical member being formed of a synthetic resin and 0.1 to 3.00 mm in thickness.

3. The tube assembly for integrated circuits as recited in claim 1, wherein the said rail member is formed of a synthetic resin having its electric resistance adjusted to not more than $10^8$ ohms square cm. by the addition of 10 to 40% by weight of carbon black or finely divided metals acting as a conductive material.

4. The tube assembly for integrated circuits as recited in claim 1, wherein the cylindrical member is of a circular cross-section, while the rail of a semicircular or substantially circular cross-section, and the cylindrical member is provided on the inner surface of its bottom with a single projection or a plurality of projections extending in the lengthwise direction thereof, while the rail is provided on its bottom with a single groove or a plurality of grooves extending along the full length thereof and in the lengthwise direction thereof, the said projections being movably inserted into the said grooves.

5. The tube assembly for integrated circuits as recited in claim 1, wherein the cylindrical member is of a circular cross-section, and is provided on the inner surfaces of its right and left sides with projections extending along the full length thereof and in the lengthwise direction thereof, the said projections abutting against the right and left sides of the upper flat portion of the rail.

6. The tube assembly for integrated circuits as recited in claim 1, wherein the cylindrical member is of a rectangular cross-section, and is provided on the inner surfaces of its right and left sides with projections which extend along the full length of said cylindrical member in the lengthwise direction thereof, the said projections abutting against the right and left sides of the upper flat portion of the rail.

7. The tube assembly for integrated circuits as recited in claim 1, wherein the cylindrical member is of a circular cross-section, and is provided on the inner surfaces of its right and left sides with projections which extend along the full length of said cylindrical member in the lengthwise direction thereof, and the right and left grooves are formed in the rail along the full length thereof and in the length direction thereof, the said projections being movably inserted into the said grooves.

8. The tube assembly for integrated circuits as recited in claim 1, wherein the cylindrical member is of a rectangular cross-section, and is provided on the inner surfaces of its right and left sides with projections which extend along the full length of the said cylindrical member in the lengthwise direction thereof, and right and left grooves are formed in the rail along the full length thereof and in the lengthwise direction thereof, the said projections being movably inserted into the said grooves.

9. The tube assembly for integrated circuits as recited in claim 1, wherein a distance between both corners of the integrated circuits attached to the rail and the inner surface of the said cylindrical member positioned just above the said both corners is made shorter than the length of the terminals of the said integrated circuits.

* * * * *